US009123588B2

(12) United States Patent
Shibata et al.

(10) Patent No.: US 9,123,588 B2
(45) Date of Patent: *Sep. 1, 2015

(54) THIN-FILM TRANSISTOR CIRCUIT SUBSTRATE AND METHOD OF MANUFACTURING THE SAME

(71) Applicant: JAPAN DISPLAY INC., Minato-ku (JP)

(72) Inventors: Tetsuya Shibata, Yokkaichi (JP); Hajime Watakabe, Fukaya (JP); Atsushi Sasaki, Ageo (JP); Yuki Matsuura, Kuki (JP); Muneharu Akiyoshi, Saitama (JP); Hiroyuki Watanabe, Sunto-gun (JP)

(73) Assignee: JAPAN DISPLAY INC., Minato-ku (JP)

( * ) Notice: Subject to any disclaimer, the term of this patent is extended or adjusted under 35 U.S.C. 154(b) by 65 days.

This patent is subject to a terminal disclaimer.

(21) Appl. No.: 14/206,858

(22) Filed: Mar. 12, 2014

(65) Prior Publication Data

US 2014/0191231 A1    Jul. 10, 2014

Related U.S. Application Data

(62) Division of application No. 13/329,545, filed on Dec. 19, 2011, now Pat. No. 8,710,498.

(30) Foreign Application Priority Data

Feb. 8, 2011    (JP) .................................. 2011-025072

(51) Int. Cl.
*H01L 29/72*    (2006.01)
*H01L 27/12*    (2006.01)
(Continued)

(52) U.S. Cl.
CPC ...... *H01L 27/1225* (2013.01); *H01L 29/66969* (2013.01); *H01L 29/7869* (2013.01); *H01L 29/78606* (2013.01)

(58) Field of Classification Search
CPC .................................................... H01L 29/7869
USPC .................................. 257/43, E21.4, E29.296
See application file for complete search history.

(56) References Cited

U.S. PATENT DOCUMENTS 8,710,498 B2 * 4/2014 Shibata et al. ................... 257/43
2009/0040411 A1 * 2/2009 Kawamura et al. ............. 349/46
(Continued)

FOREIGN PATENT DOCUMENTS

JP    05-129287 A    5/1993
JP    06-041751 A    2/1994
(Continued)

OTHER PUBLICATIONS

Office Action issued Apr. 15, 2014 in Japanese Patent Application No. 2011-025072 (with English language translation).

*Primary Examiner* — Edward Wojciechowicz
(74) *Attorney, Agent, or Firm* — Oblon, McClelland, Maier & Neustadt, L.L.P.

(57) ABSTRACT

According to one embodiment, a method of manufacturing a thin-film transistor circuit substrate including forming an oxide semiconductor thin film above an insulative substrate, forming a gate insulation film and a gate electrode which are stacked on a first region of the oxide semiconductor thin film, and exposing from the gate insulation film a second region and a third region of the oxide semiconductor thin film, the second region and the third region being located on both sides of the first region of the oxide semiconductor thin film, forming an interlayer insulation film of silicon nitride including dangling bonds of silicon, the interlayer insulation film covering the second region and the third region of the oxide semiconductor thin film, the gate insulation film and the gate electrode, and forming a source electrode and a drain electrode.

5 Claims, 4 Drawing Sheets

(51) Int. Cl.
*H01L 29/786* (2006.01)
*H01L 29/66* (2006.01)

(56) References Cited

U.S. PATENT DOCUMENTS

2010/0155718 A1 6/2010 Kirita et al.
2013/0092932 A1* 4/2013 Yamazaki et al. .............. 257/43

FOREIGN PATENT DOCUMENTS

| JP | 2003-086808 A | 3/2003 |
| JP | 2007-220817 A | 8/2007 |
| JP | 2009-272427 A | 11/2009 |
| JP | 2010-199307 | 9/2010 |
| JP | 2010-239124 A | 10/2010 |

* cited by examiner

THIN-FILM TRANSISTOR CIRCUIT SUBSTRATE AND METHOD OF MANUFACTURING THE SAME

CROSS-REFERENCE TO RELATED APPLICATIONS

This application is a divisional of U.S. application Ser. No. 13/329,545 filed Dec. 19, 2011, and is based upon and claims the benefit of priority from prior Japanese Patent Application No. 2011-025072, filed Feb. 8, 2011, the entire contents of each of which are incorporated herein by reference.

FIELD

Embodiments described herein relate generally to a thin-film transistor circuit substrate and a method of manufacturing the same.

BACKGROUND

A thin-film transistor (hereinafter also referred to as "TFT") is widely used in various kinds of flat-panel display devices such as a liquid crystal display device and an organic electroluminescence display device.

Recently, attention has been paid to an oxide semiconductor as a material which is applicable to channel layers of TFTs. For example, TFTs using an In—Ga—Zn—O (hereinafter "IGZO")-based amorphous oxide as the material of semiconductor layers have vigorously been developed. In many cases, a TFT including an oxide semiconductor thin film of, e.g. IGZO adopts an inverted staggered structure, that is, a bottom gate structure, which is easy to fabricate.

However, for example, when the TFT including the oxide semiconductor thin film is applied to the display device, there are two problems with the inverted staggered type. One problem is that the channel length cannot be decreased because of the structure of the TFT, and it is difficult to decrease the circuit area and to enhance the capability (or to improve the ON current). The other problem of the inverted staggered type is that protection of the back channel side is necessary, and if such protection is not provided, the amount of oxygen in the film of the oxide semiconductor of the channel portion would vary in the process after the TFT formation, leading to instability of transistor characteristics. Specifically, the channel portion becomes a resistor, and such problems will occur that the TFT fails to function as s switching element and the threshold voltage of the TFT greatly varies.

DETAILED DESCRIPTION

In general, according to one embodiment, a method of manufacturing a thin-film transistor circuit substrate includes forming an oxide semiconductor thin film above an insulative substrate; forming a gate insulation film and a gate electrode which are stacked on a first region of the oxide semiconductor thin film, and exposing from the gate insulation film a second region and a third region of the oxide semiconductor thin film, the second region and the third region being located on both sides of the first region of the oxide semiconductor thin film; forming an interlayer insulation film of silicon nitride including dangling bonds of silicon, the interlayer insulation film covering the second region and the third region of the oxide semiconductor thin film, the gate insulation film and the gate electrode; forming in the interlayer insulation film a first contact hole reaching the second region and a second contact hole reaching the third region; and forming a source electrode which is in contact with the second region via the first contact hole, and a drain electrode which is in contact with the third region via the second contact hole.

According to another embodiment, a thin-film transistor circuit substrate includes an oxide semiconductor thin film which is formed above an insulative substrate and includes a first region, and a second region and a third region which are formed on both sides of the first region and have a lower resistance than the first region; a gate insulation film which is formed on the first region of the oxide semiconductor thin film, and exposes the second region and the third region; a gate electrode formed on the gate insulation film; a first interlayer insulation film of silicon nitride, which covers the second region and the third region of the oxide semiconductor thin film, the gate insulation film and the gate electrode, and includes a first contact hole reaching the second region and a second contact hole reaching the third region; a source electrode which is in contact with the second region via the first contact hole; and a drain electrode which is in contact with the third region via the second contact hole.

An embodiment will now be described with reference to the accompanying drawings. In the drawings, structural elements having identical or similar functions are denoted by like reference numerals, and an overlapping description is omitted.

Figure 1:
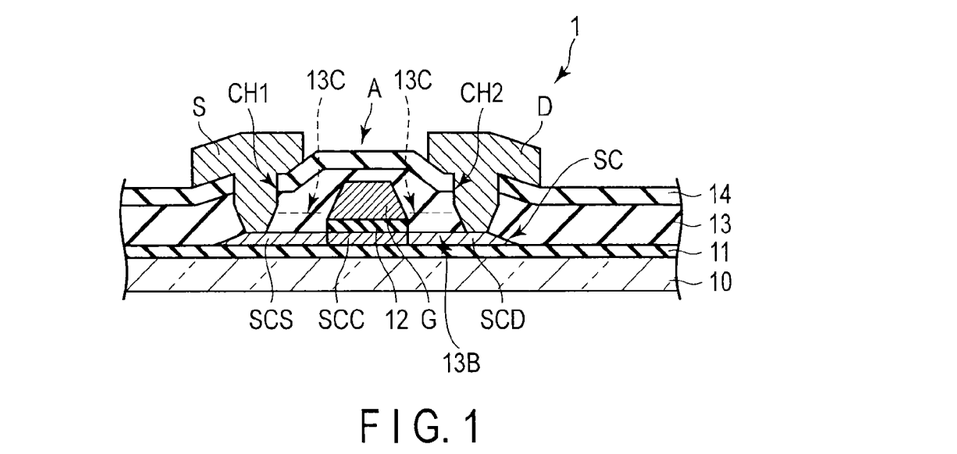
FIG. 1 is a cross-sectional view which schematically illustrates the structure of a thin-film transistor circuit substrate according to an embodiment.

FIG. 1 is a cross-sectional view which schematically illustrates the structure of a thin-film transistor circuit substrate 1 according to an embodiment.

Specifically, the thin-film transistor circuit substrate 1 is formed by using a light-transmissive insulative substrate 10, such as a glass substrate or a plastic substrate. The thin-film transistor circuit substrate 1 includes a thin-film transistor A which is formed on the insulative substrate 10. The thin-film transistor circuit substrate 1 can be applied as an array substrate of, e.g. a liquid crystal device or an organic electroluminescence (EL) device, and includes pixel electrodes (not shown) which constitute liquid crystal elements or organic EL elements. The thin-film transistor A is electrically connected to the pixel electrode.

An undercoat layer 11 is formed on the insulative substrate 10. The undercoat layer 11 is formed of, for instance, silicon oxide (SiO) or silicon nitride (SiN). An oxide semiconductor thin film SC, which constitutes the thin-film transistor A, is formed on the undercoat layer 11.

The oxide semiconductor thin film SC is formed of an oxide including, for example, at least one of indium (In), gallium (Ga) and zinc (Zn). Typical examples of the oxide, of which the oxide semiconductor thin film SC is formed, include indium gallium zinc oxide (IGZO), indium gallium oxide (IGO), indium zinc oxide (IZO), zinc tin oxide (ZnSnO), and zinc oxide (ZnO).

The oxide semiconductor thin film SC includes a first region SCC with a relatively high resistance, and a second region SCS and a third region SCD which have a lower resistance than the first region SCC and are formed on both sides of the first region SCC. In some cases, the first region SCC is referred to as a channel region or a high-resistance region, the second region SCS is referred to as a source region or a low-resistance region, and the third region SCD is referred to as a drain region or a low resistance region.

In the oxide semiconductor thin film SC, the oxygen concentration of the second region SCS and third region SCD is lower than the oxygen concentration of the first region SCC. Thereby, the resistance of the second region SCS and third region SCD is made lower than the resistance of the first region SCC.

A gate insulation film 12 is formed on the first region SCC of the oxide semiconductor thin film SC. The gate insulation film 12 is not formed on the second region SCS or third region SCD of the oxide semiconductor thin film SC, thus exposing the second region SCS and third region SCD. The gate insulation film 12 is formed of, e.g. silicon oxide (SiO).

A gate electrode G, which constitutes the thin-film transistor A, is formed on the gate insulation film 12. Specifically, the gate electrode G is located immediately above the first region SCC of the oxide semiconductor thin film SC. The gate electrode G is formed of, for example, at least one selected from the group consisting of copper (Cu), aluminum (Al), titanium (Ti), molybdenum (Mo), tungsten (W), tantalum (Ta) and chromium (Cr), or an alloy including at least one of these elements.

The second region SCS and third region SCD of the oxide semiconductor thin film SC, the gate insulation film 12 and the gate electrode G are covered with a first interlayer insulation film 13. The first interlayer insulation film 13 is also disposed on the undercoat layer 11. A first contact hole CH1, which reaches the second region SCS of the oxide semiconductor thin film SC, and a second contact hole CH2, which reaches the third region SCD, are formed in the first interlayer insulation film 13. The first interlayer insulation film 13 is formed of silicon nitride (SiN).

The first interlayer insulation film 13, which is formed of silicon nitride, is formed under the condition that the first interlayer insulation film 13 includes a great number of dangling bonds of silicon (Si). Thus, in the first interlayer insulation film 13 which is located immediately above the second region SCS and third region SCD of the oxide semiconductor thin film SC, a large quantity of oxygen included in the oxide semiconductor thin film SC is taken in a bottom-side portion 13B including an interface with the second region SCS and third region SCD, and the taken-in oxygen is coupled to the dangling bonds.

On the other hand, the degree of diffusion of the oxygen taken in the first interlayer insulation film 13 is higher in the bottom-side portion 13B than in a central portion 13C of the first interlayer insulation film 13 (i.e. a portion which is located at a position corresponding to ½ of the thickness of the first interlayer insulation film 13). Accordingly, in the first interlayer insulation film 13 which is located immediately above the second region SCS and third region SCD, the oxygen concentration of the bottom-side portion 13B is higher than the oxygen concentration of the central portion 13C. In other words, in the first interlayer insulation film 13 which is located immediately above the second region SCS and third region SCD, a greater number of dangling bonds of silicon are included in the central portion 13C than in the bottom-side portion 13B.

In the example illustrated, a second interlayer insulation film 14 is further formed on the first interlayer insulation film 13. The first contact hole CH1 and second contact hole CH2 also penetrate the second interlayer insulation film 14. The second interlayer insulation film 14 is formed of, e.g. silicon oxide (SiO) or silicon nitride (SiN).

In the thin-film transistor A, in order to suppress formation of an undesired capacitance, it is desirable that the second interlayer insulation film 14 be formed of silicon oxide which has a lower dielectric constant than silicon nitride. In the meantime, when the second interlayer insulation film 14 is formed of silicon oxide, it is possible, in some cases, to detect a boundary plane between the second interlayer insulation film 14 and the first interlayer insulation film 13 which is formed of silicon nitride.

A source electrode S and a drain electrode D, which constitute the thin-film transistor A, are formed on the second interlayer insulation film 14. The source electrode S is put in contact with the second region SCS, which corresponds to the source region of the oxide semiconductor thin film SC, via the first contact hole CH1 which penetrates the first interlayer insulation film 13 and second interlayer insulation film 14. The drain electrode D is put in contact with the third region SCD, which corresponds to the drain region of the oxide semiconductor thin film SC, via the second contact hole CH2 which penetrates the first interlayer insulation film 13 and second interlayer insulation film 14.

Each of the source electrode S and drain electrode D is formed of, for example, at least one selected from the group consisting of copper (Cu), aluminum (Al), titanium (Ti), molybdenum (Mo), tungsten (W), tantalum (Ta) and chromium (Cr), or an alloy including at least one of these elements.

The surface of the thin-film transistor circuit substrate 1 with the above-described structure, or in other words, the source electrode S, drain electrode D and second interlayer insulation film 14, are covered with a protection film (not shown).

Next, a description is given of an example of a method of manufacturing the thin-film transistor circuit substrate 1 of the present embodiment.

Figure 2A:
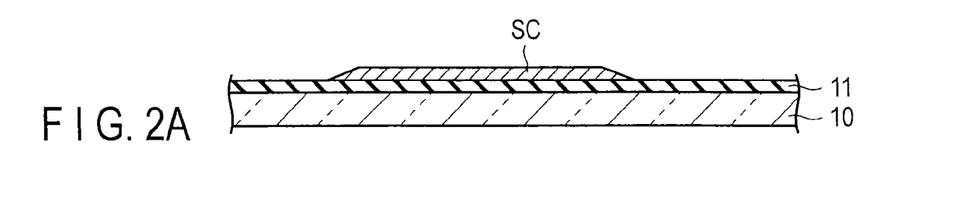
FIGS. 2A, 2B and 2C are views for describing a method of manufacturing the thin-film transistor circuit substrate in the embodiment.

To start with, as illustrated in FIG. 2A, an undercoat layer 11 is formed on an insulative substrate 10, and then an oxide semiconductor thin film SC is formed on the undercoat layer 11. In this example, a transparent glass substrate was prepared as the insulative substrate 10. In addition, the undercoat layer 11 was formed of silicon oxide (SiO) by, e.g. plasma CVD (Chemical Vapor Deposition).

The oxide semiconductor thin film SC was formed by forming an oxide semiconductor layer of indium gallium zinc oxide (IGZO) by, e.g. sputtering on the undercoat layer 11, and then patterning this oxide semiconductor layer in an island shape. The thus formed oxide semiconductor thin film SC, as a whole, has a substantially uniform initial resistance value.

Figure 2B:
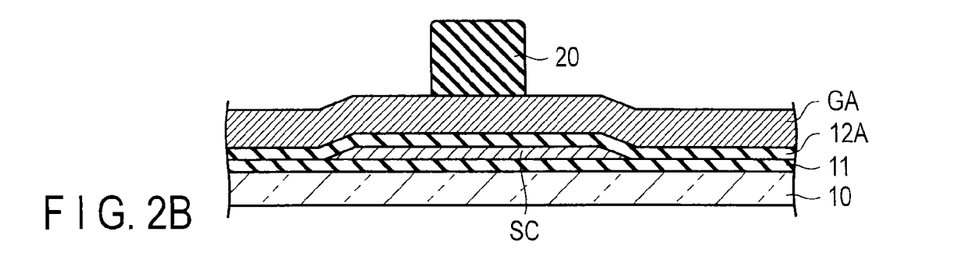
Figure 2C:
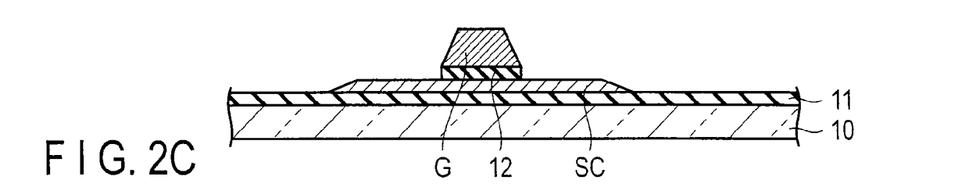

Subsequently, as illustrated in FIG. 2B and FIG. 2C, a gate insulation film 12 and a gate electrode G are formed on the oxide semiconductor thin film SC. This process step will be described below in greater detail.

To begin with, a gate insulation layer 12A for forming the gate insulation film 12 is formed. The gate insulation layer 12 was formed of silicon oxide (SiO) by, e.g. plasma CVD. The gate insulation layer 12A is formed on the oxide semiconductor thin film SC and on substantially the entire surface of the undercoat layer 11 on which the oxide semiconductor thin film SC is not formed.

Then, a gate layer GA for forming the gate electrode G is formed. The gate layer GA was formed by, e.g. sputtering. The gate layer GA is formed on substantially the entire surface of the gate insulation layer 12A.

Thereafter, a resist pattern 20 is formed on the gate layer GA. The resist pattern 20 is formed of, e.g. a photosensitive resin. The resist pattern 20 is formed immediately above a region where a relatively high resistance is to be maintained in the oxide semiconductor thin film SC, that is, immediately above a region where the first region is to be formed, and the resist pattern 20 is not disposed on regions where the resistance is to be decreased in the oxide semiconductor thin film SC, that is, immediately above regions where the second region and the third region are to be formed.

Subsequently, as shown in FIG. 2C, using the resist pattern 20 as a mask, the gate insulation layer 12A and gate layer GA are patterned in a batchwise manner. Thereby, the gate insulation film 12 and gate electrode G, which are stacked on the region, which is to become the first region of the oxide semiconductor thin film SC, are formed, and the regions, which are to become the second region and third region of the oxide semiconductor thin film SC, are exposed. Thereafter, the resist pattern 20 is removed. For example, reactive ion etching (RIE), which is a kind of plasma dry etching, is applicable to the patterning of the gate insulation layer 12A and gate layer GA.

Figure 3:
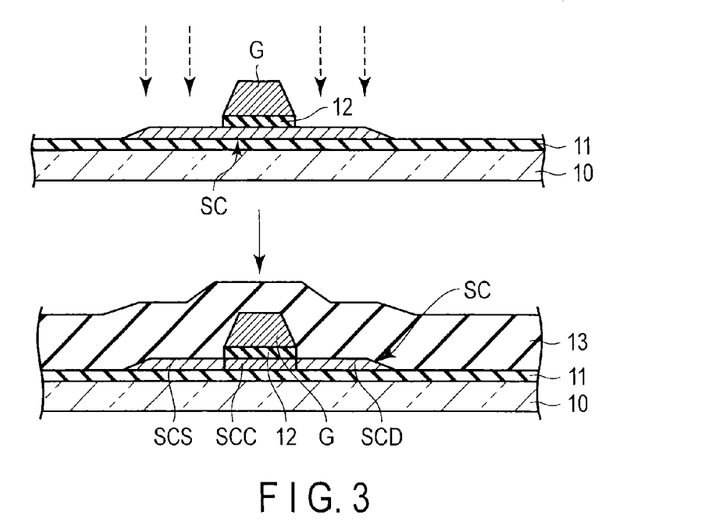
FIG. 3 is a view for describing the method of manufacturing the thin-film transistor circuit substrate in the embodiment.

Following the above, as illustrated in FIG. 3, a first interlayer insulation 13 is formed, which covers those regions of the oxide semiconductor thin film SC, which are exposed from the gate insulation film 12, namely the regions which are to become the second region and third region, covers the gate insulation film 12 and gate electrode G, and covers that part of the undercoat layer 11, on which the oxide semiconductor thin film SC is not formed. In this example, the first interlayer insulation film 13 was formed of silicon nitride (SiN) by, e.g. plasma CVD.

The first interlayer insulation film 13 was formed by using, for example, a mixture gas of silane ($SiH_4$) gas, ammonia ($NH_3$) gas and nitrogen ($N_2$) gas. In particular, in this example, the first interlayer insulation film 13 was formed under the condition that a relatively large number of dangling bonds of silicon are included (e.g. a condition of relatively low temperatures and high pressure).

Thereby, in the oxide semiconductor thin film SC, the resistance of the region, which in contact with the first interlayer insulation film 13, is made lower than the resistance of the region, which is not in contact with the first interlayer insulation film 13. Specifically, in the oxide semiconductor thin film SC, the region, which is not in contact with the first interlayer insulation film 13, becomes the first region SCC that is a high-resistance region in which a relatively high resistance state is maintained, and the regions, which are located on both sides of the first region SCC and are in contact with the first interlayer insulation film 13, become the second region SCS and third region SCD that are low-resistance regions.

Figure 4:
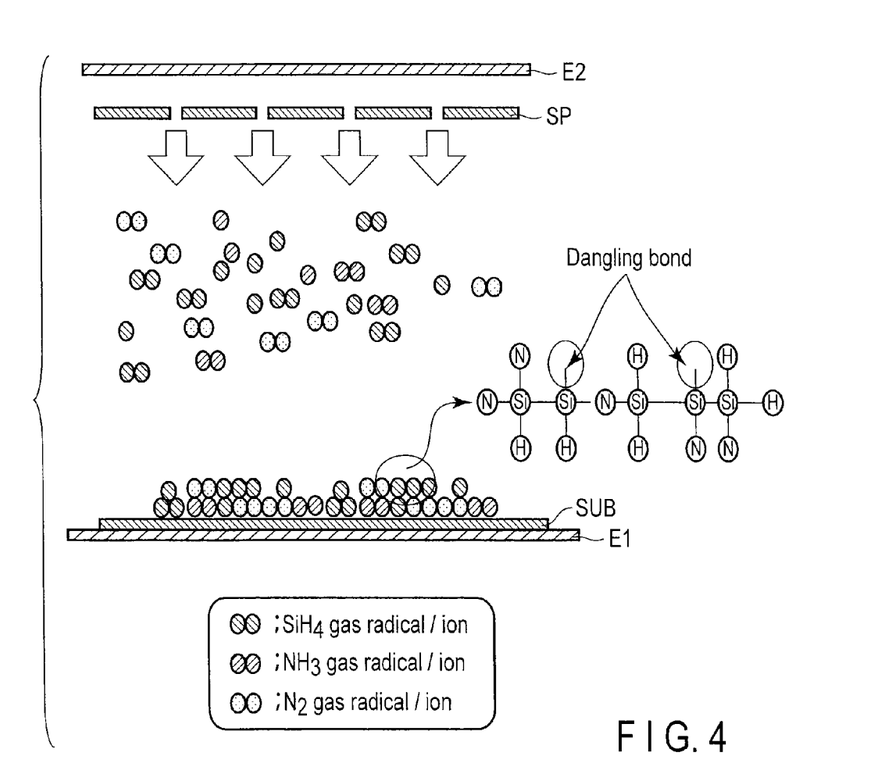
FIG. 4 is a view for describing a formation process of a first interlayer insulation film.
Figure 5:
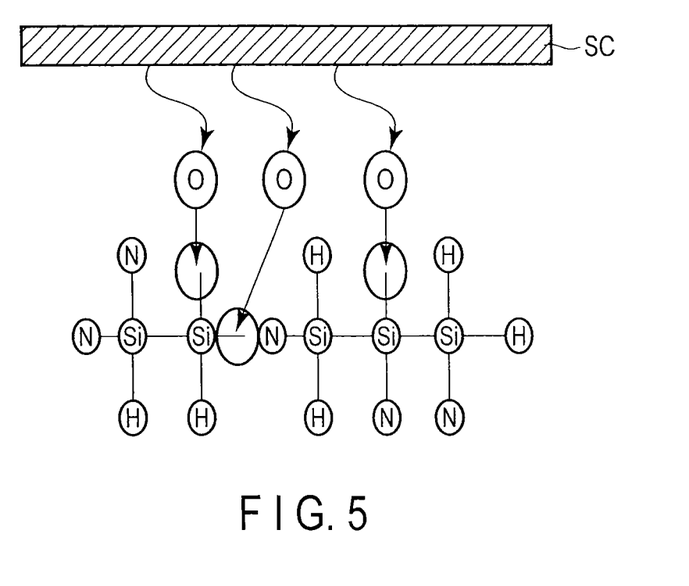
FIG. 5 is a view for describing a process of decreasing the resistance of an oxide semiconductor thin film, in accordance with the formation of the first interlayer insulation film.

FIG. 4 and FIG. 5 are views for describing a process of decreasing the resistance of the oxide semiconductor thin film SC, in accordance with the formation of the first interlayer insulation film 13.

As illustrated in FIG. 4, in a CVD apparatus, a shower plate SP is disposed between a first electrode E1 and a second electrode E2. A process substrate SUB, on which the process up to the formation of the gate electrode G has been completed, is disposed between the first electrode E1 and the shower plate SP.

A plasma is generated by applying a bias to the second electrode E2 while introducing a mixture gas of silane ($SiH_4$) gas, ammonia ($NH_3$) gas and nitrogen ($N_2$) gas. Then, decomposed radicals or ions, as shown in FIG. 4, deposit on the process substrate SUB disposed on the first electrode E1. As illustrated in FIG. 4, dangling bonds of silicon (Si) are included in the first interlayer insulation film 13 which is thus formed of silicon nitride.

As shown in FIG. 5, in the region where the first interlayer insulation film 13 and the oxide semiconductor thin film SC are in contact, oxygen is extracted from the oxide semiconductor thin film SC, and the extracted oxygen is coupled to the dangling bonds of silicon, which are included in the first interlayer insulation film 13. Thus, in the oxide semiconductor thin film SC which is in contact with the first interlayer insulation film 13, the electrical resistance can be decreased in accordance with the decrease in oxygen concentration.

As a result, in the oxide semiconductor thin film SC, the first region SCC having a relatively high resistance is formed in the region which is not in contact with the first interlayer insulation film 13, and the second region SCS and third region SCD, which have a lower oxygen concentration than the first region SCC and have a relatively low resistance, are formed in the regions which are in contact with the first interlayer insulation film 13.

On the other hand, in the first interlayer insulation film 13, the oxygen concentration increases locally, in accordance with the taking-in of oxygen from the oxide semiconductor thin film SC. Specifically, in the first interlayer insulation film 13 which is formed immediately above the second region SCS and third region SCD, the oxygen concentration of the bottom-side portion thereof is higher than the oxygen concentration of the central portion thereof. In addition, in the first interlayer insulation film 13, the oxygen concentration of the regions immediately above the second region SCS and third region SCD is higher than the oxygen concentration of the region immediately above the first region SCC.

If attention is paid to the dangling bonds of silicon in the first interlayer insulation film 13, in the first interlayer insulation film 13 that is formed immediately above the second region SCS and third region SCD, the central portion thereof includes a greater number of dangling bonds than the bottom-side portion thereof. In addition, in the first interlayer insulation film 13, the region immediately above the first region SCC includes a greater number of dangling bonds than each of the regions immediately above the second region SCS and third region SCD.

Next, a description is given of the subsequent part of the manufacturing method.

Figure 6A:
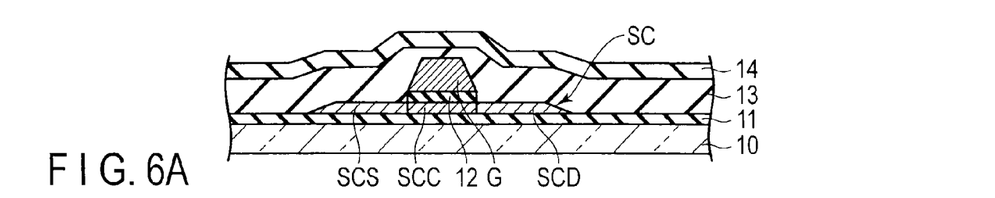
FIGS. 6A, 6B and 6C are views for describing the method of manufacturing the thin-film transistor circuit substrate in the embodiment.

As illustrated in FIG. 6A, a second interlayer insulation film 14 is formed on the first interlayer insulation film 13. In this example, the second interlayer insulation film 14 was formed of silicon oxide (SiO) by, e.g. plasma CVD. The second interlayer insulation film 14 is formed on substantially the entire surface of the first interlayer insulation film 13.

Figure 6B:
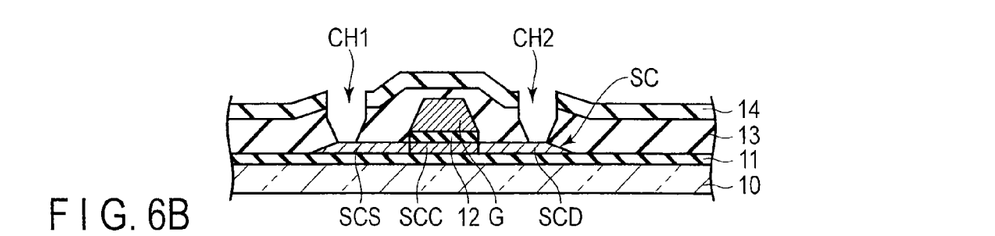

Then, as shown in FIG. 6B, a first contact hole CH1, which reaches the second region SCS of the oxide semiconductor thin film SC, and a second contact hole CH2, which reaches the third region SCD of the oxide semiconductor thin film SC, are formed in the first interlayer insulation film 13 and second interlayer insulation film 14. The first contact hole CH1 and second contact hole CH2 were formed by reactive ion etching (RIE), by using, as a mask, a resist pattern which is not described in detail.

Figure 6C:
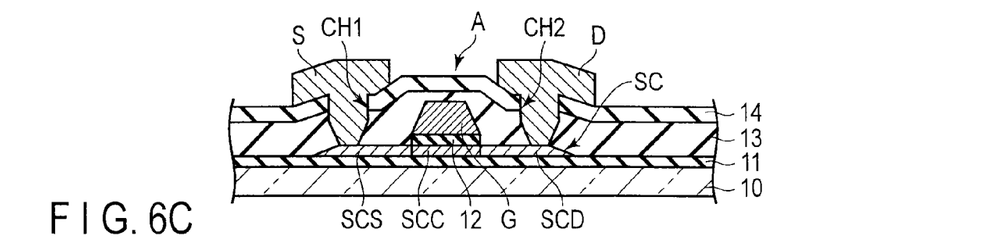

Subsequently, as illustrated in FIG. 6C, a source electrode S, which is put in contact with the second region SCS via the first contact hole CH1, and a drain electrode D, which is put in contact with the third region SCD via the second contact hole CH2, are formed. The source electrode S and drain electrode D were formed by forming a metal film by, e.g. sputtering, and then patterning the metal film.

By the above-described fabrication steps, the thin-film transistor circuit substrate 1 including the thin-film transistor A is manufactured. The thus manufactured thin-film transistor circuit substrate 1 is then assembled in a display device through fabrication steps of a liquid crystal display element or an organic EL element.

As has been described above, the thin-film transistor A, which is manufactured in the present embodiment, has a coplanar-type top-gate structure, and the first region SCC, which corresponds to the channel region of the oxide semiconductor thin-film SC, is protected by the gate insulation film 12 and gate electrode G. Thus, oxygen can stably be retained, and the high-resistance state can be maintained. In addition, since the channel length, which is determined by the width of the gate electrode G, can be decreased, the ON current is improved and the capability of the thin-film transistor A can be enhanced. Moreover, in the case where the thin-film transistor A is of the coplanar type of the top gate, when the thin-film transistor A is used as a switching element of, e.g. a display device, stable transistor characteristics can be obtained even through a heat process after transistor formation.

Besides, according to the present embodiment, when the thin-film transistor A is formed, in the state in which the regions of the oxide semiconductor thin film SC, where the second region SCS and third region SCD that become low-resistance regions are to be formed, are exposed, these regions are covered with the first interlayer insulation film 13 which is formed of silicon nitride. Thereby, since the dangling bonds of silicon included in the first interlayer insulation film 13 are coupled to the oxygen contained in the oxide semiconductor thin film SC, the oxygen concentration in these regions lowers, and the decrease in resistance can be realized. Specifically, since the resistance-decreasing process of the oxide semiconductor thin film SC is performed during the process of forming the first interlayer insulation film 13, there is no need to perform an additional step, such as a hydrogen plasma process step, solely for the purpose of decreasing the resistance of the oxide semiconductor thin film SC, and the process can be simplified. Therefore, the manufacturing cost can be reduced.

Figure 7:
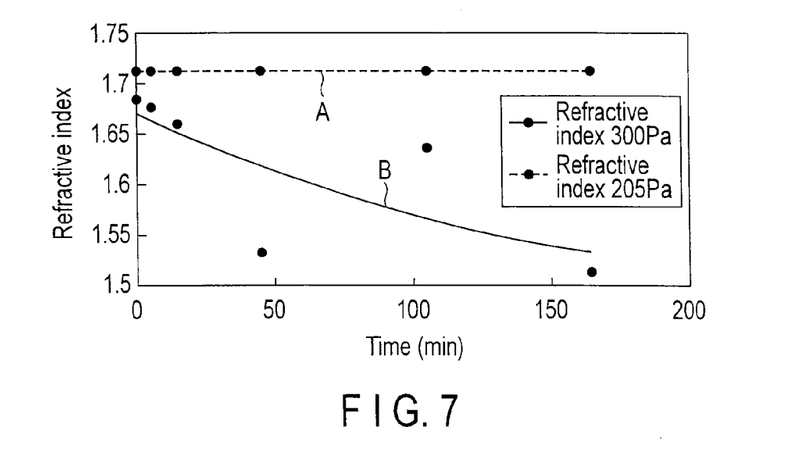
FIG. 7 is a view illustrating an example of a formation condition of a silicon nitride film including a greater number of dangling bonds of silicon.

FIG. 7 is a graph illustrating an example of a formation condition of a silicon nitride film including a greater amount of dangling bonds of silicon.

In this example, when silicon nitride films were formed by plasma CVD, two kinds of silicon nitride films were formed under the same conditions except a pressure condition. One silicon nitride film A was formed under a relatively low pressure condition of 205 Pa, and the other silicon nitride film B was formed under a relatively high pressure condition of 300 Pa. The silicon nitride films A and B were formed at a relatively low temperature of 100° C.

The silicon nitride films A and B, which were formed under the respective conditions, were left in the atmospheric air, and the refractive indices thereof were measured after the passing of a predetermined time. The abscissa of the graph of FIG. 7 indicates a time during which the silicon nitride films A and B were left in the atmospheric air, and the ordinate indicates measured values of refractive indices of the silicon nitride films A and B.

As shown in FIG. 7, the refractive index of the silicon nitride film A, which was formed under the low pressure condition, hardly varied. On the other hand, as regards the silicon nitride film B which was formed under the high pressure condition, the tendency of decrease of the refractive index was confirmed.

In general, the refractive index of a silicon nitride film is higher than the refractive index of a silicon oxide film. Hence, the silicon nitride film A, which was formed under the low pressure condition, includes a less number of dangling bonds, and is stable in the atmospheric air, and therefore the refractive index hardly varied. On the other hand, it is thought that since the silicon nitride film B, which was formed under the high pressure condition, includes a greater number of dangling bonds, the oxygen in the atmospheric air was coupled to the dangling bonds with the passing of time, and the silicon nitride film was gradually made into a silicon oxide film, resulting in a decrease in refractive index with the passing of time.

Specifically, it is thought that the silicon nitride film B, which was formed under the high pressure condition, includes a greater number of dangling bonds than the silicon nitride film A, which was formed under the low pressure condition. In the present embodiment, by adopting such a high pressure condition, the first interlayer insulation film 13 of silicon nitride was formed. Thereby, the lowering of resistance of the oxide semiconductor thin film can be promoted.

As has been described above, according to the present embodiment, it is possible to provide a thin-film transistor circuit substrate which can reduce the manufacturing cost and can obtain stable transistor characteristics, and a method of manufacturing the thin-film transistor circuit substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    an oxide semiconductor thin film including a first region, and a second region and a third region which are formed on both sides of the first region and have a lower resistance than the first region;
    a gate electrode opposed to the first region;
    a gate insulation film positioned between the oxide semiconductor thin film and the gate electrode;
    a first interlayer insulation film of silicon nitride, which covers the second region and the third region of the oxide semiconductor thin film and the gate electrode;
    a source electrode which is in contact with the second region; and
    a drain electrode which is in contact with the third region,
    wherein in the first interlayer insulation film covering the second region and the third region, an oxygen concentration of an end portion which is in contact with the oxide semiconductor thin film is higher than an oxygen concentration of a central portion which is located at a position corresponding to ½ of a thickness of the first interlayer insulation film.

2. The display device according to claim 1, wherein in the oxide semiconductor thin film, an oxygen concentration of the second region and the third region is lower than an oxygen concentration of the first region.

3. The display device according to claim 1, wherein the first interlayer insulation film includes, at least in the end portion, dangling bonds of silicon.

4. The display device according to claim 3, wherein in the first interlayer insulation film, a central portion which is located at a position corresponding to ½ of a thickness of the first interlayer insulation film includes a greater number of dangling bonds of silicon than the end portion.

5. The display device according to claim 1, wherein the oxide semiconductor thin film is formed of an oxide including at least one of indium (In), gallium (Ga), and zinc (Zn).

* * * * *